(12) United States Patent
Ishikawa et al.

(10) Patent No.: US 9,326,376 B2
(45) Date of Patent: Apr. 26, 2016

(54) PRINTED WIRING BOARD

(71) Applicant: MEIKO ELECTRONICS CO., LTD., Ayase-shi, Kanagawa (JP)

(72) Inventors: Akihiro Ishikawa, Ayase (JP); Toru Yamamoto, Ayase (JP); Kazuya Inokuchi, Ayase (JP)

(73) Assignee: MEIKO ELECTRONICS CO., LTD., Ayase-Shi, Kanagawa (JP)

( * ) Notice: Subject to any disclaimer, the term of this patent is extended or adjusted under 35 U.S.C. 154(b) by 0 days.

(21) Appl. No.: 14/649,204

(22) PCT Filed: Jan. 14, 2014

(86) PCT No.: PCT/JP2014/050431
§ 371 (c)(1),
(2) Date: Jun. 2, 2015

(87) PCT Pub. No.: WO2015/079713
PCT Pub. Date: Jun. 4, 2015

(65) Prior Publication Data
US 2015/0373829 A1    Dec. 24, 2015

(51) Int. Cl.
*H05K 1/00* (2006.01)
*H05K 1/02* (2006.01)

(52) U.S. Cl.
CPC ...................... *H05K 1/028* (2013.01)

(58) Field of Classification Search
CPC ............. H05K 1/00; H05K 1/02; H05K 1/03; H05K 1/09; H05K 1/11; H05K 1/16; H05K 1/18; H05K 3/00; H05K 3/10; H01L 21/77; H01L 23/48; H01L 23/52; G02B 6/02; G02B 6/12; G02B 6/122; G02B 6/132

USPC ......... 174/254, 250, 251, 255, 257, 258, 260, 174/261, 266; 438/24; 257/669, 753, 773
See application file for complete search history.

(56) References Cited

U.S. PATENT DOCUMENTS

| 2009/0092353 A1* | 4/2009 | Chan et al. ..................... 385/14 |
| 2009/0093073 A1* | 4/2009 | Chan et al. ..................... 438/24 |
| 2013/0249740 A1* | 9/2013 | Shedletsky ............. 343/700 MS |

FOREIGN PATENT DOCUMENTS

| JP | 08125342 A | 5/1996 |
| JP | 10224017 A | 8/1998 |

(Continued)

OTHER PUBLICATIONS

Written Opinion for PCT/JP2014/050431, mailing date of Apr. 8, 2014.

*Primary Examiner* — Xiaoliang Chen
(74) *Attorney, Agent, or Firm* — Marshall, Gerstein & Borun LLP

(57) ABSTRACT

A printed wiring board includes: an inner layer structure body containing at least an inner layer insulative base material composed of a glass cloth and resin which covers the glass cloth and not containing a resin insulative base material composed only of resin; outer layer wiring formed on a first face of the inner layer structure body; and a solder resist layer formed on a surface of the outer layer wiring, wherein in the inner layer structure body, an opening part is formed, and the solder resist layer is composed of a first ink part covering at least the outer layer wiring that is formed on a partial region of the first face which corresponds to the opening part and a second ink part interposing both ends of the first ink part and being lower in flexibility than the first ink part.

8 Claims, 3 Drawing Sheets

(56) References Cited

FOREIGN PATENT DOCUMENTS

| | | | |
|---|---|---|---|
| JP | 2002072476 A | 3/2002 |
| JP | 2007096131 A | 4/2007 |
| JP | 2009290193 A | 12/2009 |
| JP | 2013098536 A | 5/2013 |
| WO | WO-2004070826 A1 | 8/2004 |

* cited by examiner

PRINTED WIRING BOARD

TECHNICAL FIELD

The present invention relates to a printed wiring board having a property of folding by undergoing spot facing processing.

BACKGROUND ART

Conventionally, in order to realize a structure which is folded and implemented in various electric/electronic devices (flex-to-install structure), various wiring boards have been used, such as a flexible wiring board which has flexibility, a joint wiring board obtained by joining a rigid wiring board which is relatively hard and does not have flexibility with the relevant flexible wiring board, or a rigid-flexible wiring board obtained by integrating the relevant flexible wiring board and the relevant rigid wiring board without forming a junction therebetween.

In particular, as wiring boards for limited usage of folding, a wiring board is known which is obtained by performing spot facing processing on a rigid wiring board with a machining tool such as an endmill, and thereby, can be folded at an opening part formed by the relevant spot facing processing as a folding point. Adopting such a structure enables costs to be reduced to the wiring board. For example, as the rigid wiring board which undergoes the spot facing processing, a prepreg is used which is a base material in the state where one glass cloth is immersed in thermosetting resin such as epoxy resin, and after that, it is dried under heating and is semi-set. Moreover, Patent Literatures 1 and 2 disclose printed circuit boards employing such a foldable structure.

PRIOR ART DOCUMENT

Patent Document

Patent Document 1: Japanese Patent Application Laid-Open No. 2007-96131

Patent Document 2: Japanese Patent Application Laid-Open No. 2013-98536

SUMMARY OF THE INVENTION

Problems to be Solved by the Invention

In a printed wiring board disclosed in Patent Literature 1, two wiring boards with different modulus of elasticity are layered and the wiring board with the higher modulus of elasticity undergoes spot facing. Thereby, a property of folding in the printed wiring board is improved. Moreover, in a foldable printed circuit board disclosed in Patent Literature 2, an adhesive layer which is composed of resin and does not contain a glass cloth is provided between two prepregs, the relevant adhesive layer is disposed on the bottom face of the opening obtained by spot facing processing, the relevant adhesive layer has high softness, and thereby, a property of folding of the foldable printed circuit board itself is improved.

However, use of two wiring boards with different modulus of elasticity and/or use of an adhesive layer not containing a glass cloth cause manufacturing costs of the printed wiring board itself to increase. Moreover, formation of the adhesive layer not containing a glass cloth causes complex processes such as layering, boring for formation of via holes, and roughening of surfaces. Thus, the manufacturing process cannot be simplified.

Furthermore, in the UL (Underwriters Laboratories Inc) standard which is a standard for certifying safety of electric products in the United States, the smallest thickness of the printed wiring board is regulated for each of different materials which are portions on which spot facing processing is performed. Specifically, when a material whose minimum thickness is regulated to be 200 µm and a material whose minimum thickness is regulated to be 150 µm are used as a composite, they are required to have 200 µm or more and 150 µm or more in thicknesses, respectively, which causes the total thickness of the wiring board to be 350 µm or more. Thus, when different materials are used, restriction on the thickness of the printed wiring board itself becomes serious.

Therefore, in order to solve the above-mentioned problem, it can be considered that relatively cheap typical rigid wiring boards (each is a prepreg constituted of one glass cloth and epoxy resin) are layered via copper foils without using different kinds of wiring boards, an adhesive not containing a glass cloth, or the like. Nevertheless, this cannot attain sufficient property of folding or reliability. This cannot be sufficiently compatible with various kinds of usage as a printed wiring board.

The present invention is devised in view of such a problem, and an object thereof is to provide a printed wiring board capable of attaining sufficient property of folding and reliability while costs are reduced and a desired standard is satisfied.

Means for Solving the Problems

In order to achieve the above-mentioned object, a printed wiring board according to the present invention includes: an inner layer structure body containing at least an inner layer insulative base material composed of a glass cloth and resin which covers the glass cloth and not containing a resin insulative base material composed only of resin; outer layer wiring formed on a first face of the inner layer structure body; and a solder resist layer formed on a surface of the outer layer wiring, wherein in the inner layer structure body, an opening part which extends from a second face positioned opposite to the first face toward an inside and does not reach the first face is formed, and the solder resist layer is composed of a first ink part covering at least the outer layer wiring that is formed on a partial region of the first face which corresponds to the opening part and a second ink part interposing both ends of the first ink part and being lower in flexibility than the first ink part.

Advantageous Effects of the Invention

In the printed wiring board according to the present invention, sufficient property of folding and reliability can be attained while costs are reduced and a desired standard is satisfied.

MODE FOR CARRYING OUT THE INVENTION

Hereafter, embodiments of the present invention are described in detail based on examples with reference to the drawings. Notably, the present invention is not limited to the content described below but can be implemented with any modification without departing from the scope thereof. Moreover, every drawing used for the description of the examples schematically illustrates a printed wiring board according to the present invention and constituting members thereof, and sometimes does not correctly represent scales, shapes or the like of the printed wiring board and the constituting members thereof, for it undergoes partial emphasis, enlargement, shrinkage, omission and/or the like for better understanding. Furthermore, various numerical values used in the examples are sometimes exemplary and can be modified in various manners as needed.

<Examples>

Figure 1:
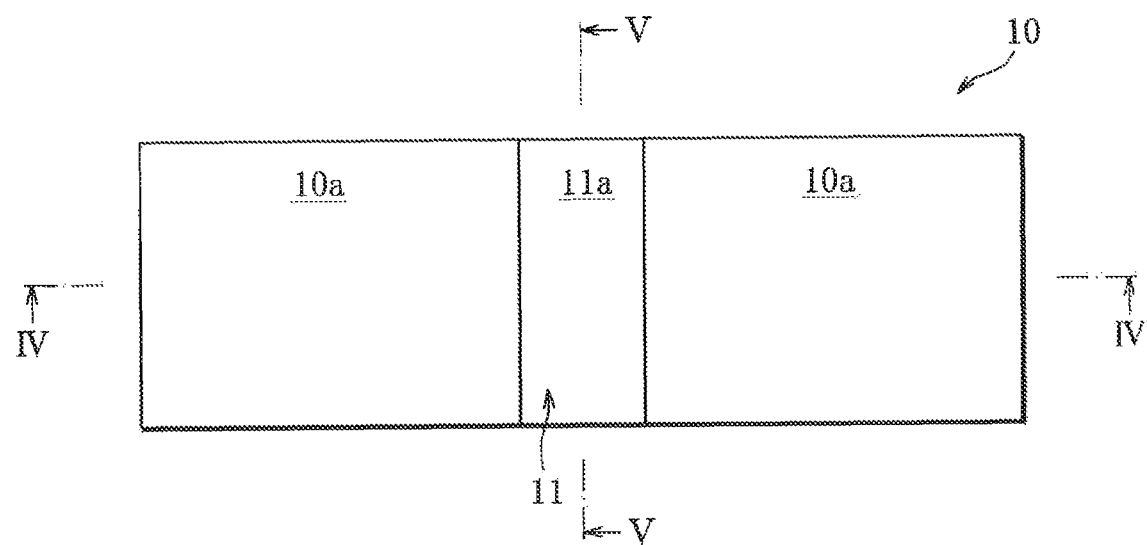
FIG. 1 is a plan view of a printed wiring board according to an example of the present invention.
Figure 2:
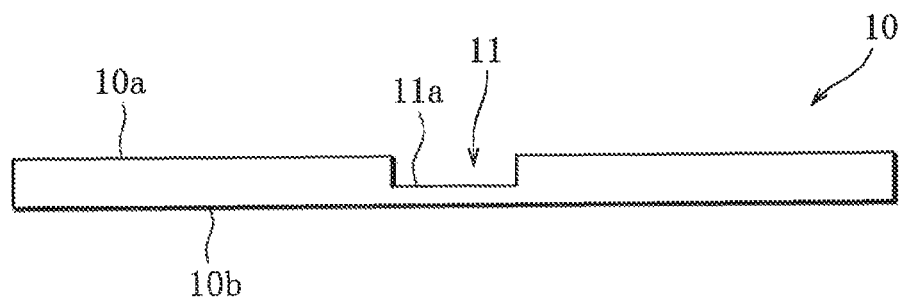
FIG. 2 is an elevation view of the printed wiring board according to the example of the present invention.

Hereafter, an overall structure of a printed wiring board 10 according to an example of the present invention is described with reference to FIG. 1 to FIG. 3. Herein, FIG. 1 is a plan view of the printed wiring board 10 according to the example. Moreover, FIG. 2 is an elevation view of the printed wiring board 10 according to the example. Furthermore, FIG. 3 is an elevation view illustrating a usage state of the printed wiring board 10 according to the example.

As illustrated in FIG. 1 and FIG. 2, the printed wiring board 10 according to the example is a flat plate-shaped board whose planar shape is rectangular. Moreover, in the printed wiring board 10, an opening part 11 is formed in a center part of the printed wiring board 10 so as to be parallel to the short sides in the plan view of FIG. 1. As seen from FIG. 1 and FIG. 2, the opening 11 extends from one of the long sides in the plan view of FIG. 1 toward the other thereof, is formed on a first face 10a side of the printed wiring board 10, and does not reach a second face 10b of the printed wiring board 10.

Figure 3:
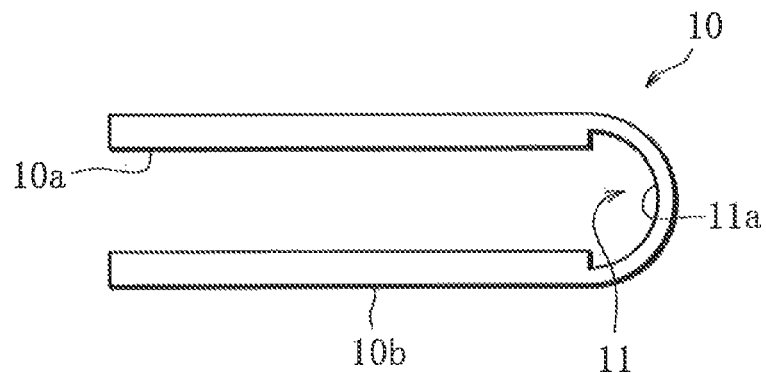
FIG. 3 is an elevation view of a usage state of the printed wiring board according to the example of the present invention.

While the printed wiring board 10 according to the example has a property of being relatively hard as a whole, it can be readily folded as illustrated in FIG. 3 with the opening part 11 being a folding point (center of folding) by the opening part 11 formed in the center part of the wiring board.

Notably, although not illustrated in FIG. 1 or FIG. 2, terminals and the like for implementing various electric/electronic components such as a plurality of wiring patterns, resistors, capacitors and semiconductor elements are formed on the first face 10a of the printed wiring board 10 according to the example. Moreover, the planar shape of the printed wiring board 10 is not limited to a rectangle but can be properly modified according to the shape of an electronic/electric device in which the printed wiring board 10 is to be implemented.

Figure 4:
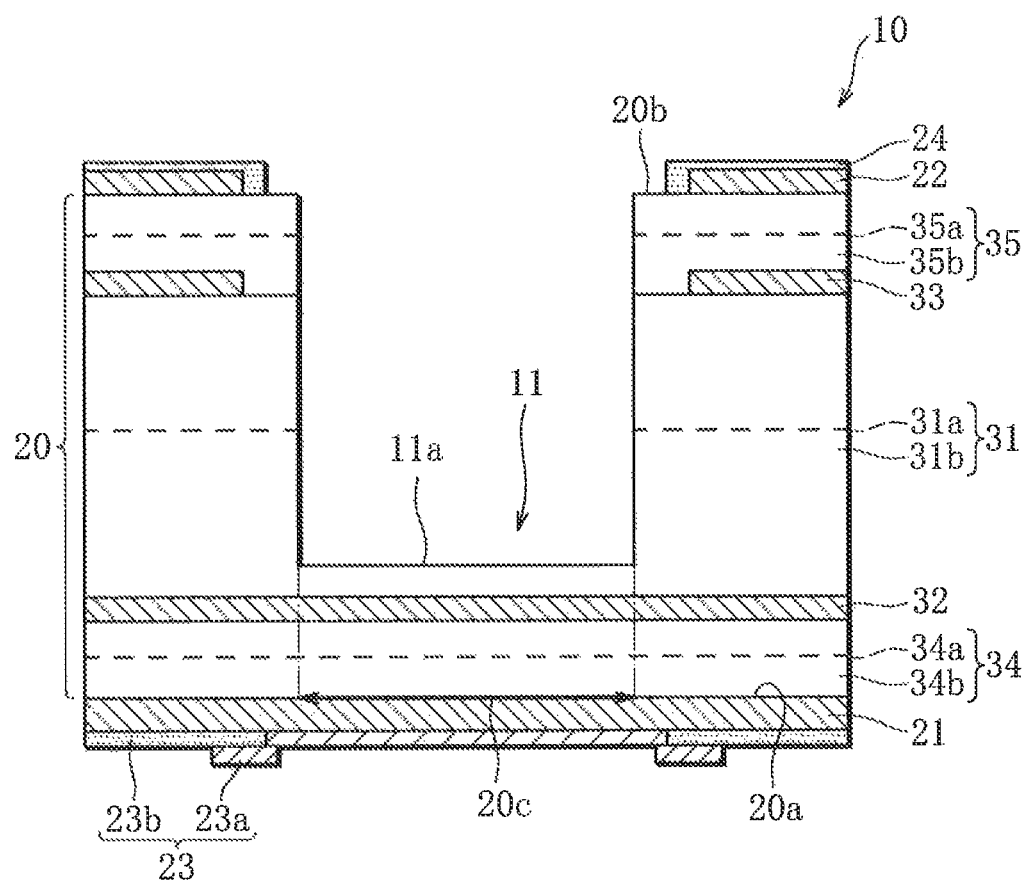
FIG. 4 is a partial expanded sectional view taken along the line IV-IV in FIG. 1.
Figure 5:
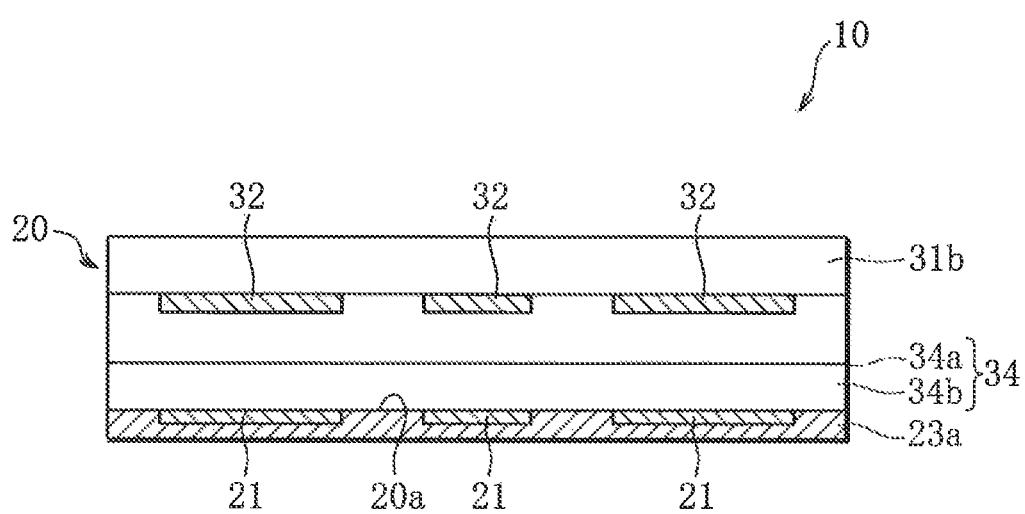
FIG. 5 is a partial expanded end face view taken along the line V-V in FIG. 1.

Next, with reference to FIG. 4 and FIG. 5, a detailed structure of the printed wiring board 10 according to the example is described. Herein, FIG. 4 is a partial expanded sectional view taken along the line IV-IV in FIG. 1. Moreover, FIG. 5 is a partial expanded end face view taken along the line V-V in FIG. 1.

As illustrated in FIG. 4 and FIG. 5, the printed wiring board 10 according to the example has a structure in which an inner layer structure body 20, a first outer layer copper foil 21 formed on a first face 20a of the inner layer structure body, a second outer layer copper foil 22 formed on a second face 20b of the inner layer structure body, a first solder resist layer 23 formed on a surface of the first outer layer copper foil 21, and a second solder resist layer 24 formed on a surface of the second outer layer copper foil 22 are layered. Herein, the inner layer structure body 20 includes a structure in which a first glass epoxy layer 31 which is an inner layer insulative base material positioned in a center part of the layered structure, a first inner layer copper foil 32 and a second inner layer copper foil 33 which are formed on the front and rear surfaces of the first glass epoxy layer 31, a second glass epoxy layer 34 which is an additional inner layer insulative base material formed on a surface of the first inner layer copper foil 32, and a third glass epoxy layer 35 which is an additional inner layer insulative base material formed on a surface of the second inner layer copper foil 33 are layered. Namely, the inner layer structure body 20 includes a structure in which a plurality of inner layer insulative base materials (the first glass epoxy layer 31, the second glass epoxy layer 34 and the third glass epoxy layer 35) are layered via the first inner layer copper foil 32 and the second inner layer copper foil 33.

Moreover, the first glass epoxy layer 31 is constituted of a glass cloth 31a and epoxy resin 31b covering the glass cloth 31a. Similarly, the second glass epoxy layer 34 is constituted of a glass cloth 34a and epoxy resin 34b, and the third glass epoxy layer 35 is constituted of a glass cloth 35a and epoxy resin 35b. Herein, the first glass epoxy layer 31 is referred to as a laminate since it is handled in the manufacturing process in the state where the first inner layer copper foil 32 and the second inner layer copper foil 33 are pasted thereon, and the second glass epoxy layer 34 and the third glass epoxy layer 35 are referred to as prepregs since they are handled in the manufacturing process in the state of being independent (that is, in the state where copper foils are not pasted thereon). The materials of these layers are the same, and all of them are sometimes referred to as prepregs. Moreover, the member in the state where the first inner layer copper foil 32 and the second inner layer copper foil are pasted on the first glass epoxy layer 31 is also referred to as a copper clad laminate (CCL).

Notably, while a glass epoxy layer composed of a glass cloth and epoxy resin is used as the inner layer insulative base material of the printed wiring board 10 in the example, another thermosetting resin in place of the epoxy resin may be used.

In the example, a layer thickness of the first glass epoxy layer 31 is adjusted to fall within a range of 200 μm or more and 1200 μm or less, and layer thicknesses of the second glass epoxy layer 34 and the third glass epoxy layer 35 are adjusted to fall within a range of 100 μm or more and 200 μm or less. Moreover, layer thicknesses of the first inner layer copper foil 32 and the second inner layer copper foil 33 are adjusted to fall within a range of 18 μm or more and 70 μm or less, and layer thicknesses of the first outer layer copper foil 21 and the second outer layer copper foil 22 are adjusted to fall within a range of 18 μm or more and 75 μm or less. Notably, these layer thicknesses can be properly modified even out of the above-mentioned ranges according to usage of the printed wiring board 10 and reliability required for the same. In particular, the layer thicknesses of the first glass epoxy layer 31, the second glass epoxy layer 34 and the third glass epoxy layer 35 are adjusted to realize better impedance matching.

Moreover, each of the first outer layer copper foil 21, the second outer layer copper foil 22, the first inner layer copper foil 32 and the second inner layer copper foil 33 undergoes desired patterning and is to function as various kinds of electric wiring or ground wiring. Notably, while copper is used as materials of the inner layer wiring and the outer layer wiring of the printed wiring board 10 in the example, wiring materials of gold, silver and the like may be used to form the wiring in the inner layer and the outer layer according to usage of the printed wiring board 10 and reliability required for the same.

As seen from FIG. 4 and FIG. 5, the opening part 11 formed in the inner layer structure body 20 extends from the second face 20b toward the inside and does not reach the first face 20a. More specifically, the opening part 11 penetrates the third glass epoxy layer 35 and the glass cloth 31a of the first glass epoxy layer 31 and reaches the epoxy resin 31b of the first glass epoxy layer 31. A bottom face 11a of the opening part 11 is positioned inside the epoxy resin 31b. Namely, in the example, the opening part 11 does not reach the first inner layer copper foil 32.

Moreover, as seen from FIG. 4 and FIG. 5, in a portion where the thickness of the printed wiring board 10 is thinnest (that is, a portion where the opening part 11 is formed), the epoxy resin 31b, the first inner layer copper foil 32, the epoxy resin 34b, the glass cloth 34a, the first outer layer copper foil 21, and a first ink part 23a constituting the first solder resist layer 23 are layered. Namely, in the portion where the opening part 11 of the printed wiring board 10 is formed, a second ink part 23b constituting the first solder resist layer 23 is not layered. Hereafter, including a configuration of disposing such first ink part 23a and second ink part 23b, the first solder resist layer 23 and the second solder resist layer 24 are described.

The first solder resist layer 23 is constituted of the first ink part 23a covering at least the first outer layer copper foil 21 that is formed on a partial region 20c of the first face 20a which corresponds to the opening part 11, and the second ink part 23b formed so as to interpose both ends of the first ink part 23a. In other words, the first ink part 23a covers at least the first outer layer copper foil 21 that is formed on the first face 20a that is the portion where the thickness of the inner layer structure body 20 is thinnest, and the second ink part 23b covers the first outer layer copper foil 21 that is formed on the first face 20a that is except the portion where the thickness of the inner layer structure body 20 is thinnest (that is the portion where the opening part 11 is not formed) and interposes both ends of the first ink part 23a. In the example, the first ink part 23a covers not only the first outer layer copper foil 21 that is formed on the region 20c but also the first outer layer copper foil 21 that is formed on a region close to an outer side of the region 20c. Namely, the first ink part 23a is formed over a wider region than the bottom face 11a of the opening part (for example, wider by approximately 0.5 mm). Moreover, the first ink part 23a and the second ink part 23b are layered such that the first ink part 23a covers the second ink part 23b in a boundary portion between them. In the example, the width of the relevant region of layering is approximately 0.5 mm. Furthermore, in the example, the layer thickness of the first ink part 23a is adjusted to be 20 μm or less, and the layer thickness of the second ink part 23b is adjusted to fall within a range of 20 μm or more and 40 μm or less, the layer thickness of the first ink part 23a being thinner than the layer thickness of the second ink part 23b.

The first ink part 23a is constituted of a special member obtained by mixing acrylate resin, acrylic monomer, epoxy resin and filler in a desired mixing ratio. Meanwhile, the second ink part 23b is constituted of a typical member obtained by mixing acrylate resin, acrylic monomer, epoxy resin and filler in a typical mixing ratio. In the example, for the first ink part 23a, the mixing ratio of the above-mentioned materials is adjusted such that it can have more excellent flexibility than the second ink part 23b and can have sufficient heat resistance even with the layer thickness being not more than 20 μm. More specifically, a content ratio of the acrylic monomer which affects flexibility, heat resistance and durability against various kinds of surface processing is lower for the first ink part 23a than the second ink part 23b. Herein, the excellent flexibility, for example, for the printed wiring board 10 according to the example means that the first ink part 23a does not suffer cracks even when the printed wiring board 10 is folded a plurality of times with the opening part 11 being the folding point in the case where the width of the opening part 11 (that is, the length of the region 20c) is set to be 5.4 mm. Notably, when such folding is performed once in the case where the first solder resist layer 23 is formed only of the member constituting the second ink part 23b, the second ink part 23b on the first outer layer copper foil 21 that is formed on the region 20c is to suffer cracks. Moreover, the sufficient heat resistance means that the first outer layer copper foil 21 can be protected and characteristics as the solder resist can be satisfied, for example, even when the printed wiring board 10 is immersed in a solder bath at approximately 288° C. or 260° C. (2 times of 10 seconds).

Notably, in view of improving flexibility, heat resistance and durability against various kinds of surface processing, the first ink part 23a may contain no acrylic monomer. In view of further improving flexibility, heat resistance and durability against various kinds of surface processing, epoxy resin may be replaced by polyimide.

Moreover, the first ink part 23a and the second ink part 23b may be layered in the boundary portion between them such that the second ink part 23b covers the first ink part 23a, and even in this case, the second ink part 23b is needed not to spread to the portion where the thickness of the printed wiring board 10 is thinnest. Herein, the reason for that both ink parts are layered in the boundary portion between the first ink part 23a and the second ink part 23b is that there is a concern that the first outer layer copper foil 21 would be exposed without the side parts (lateral faces) of the first ink part 23a and the second ink part 23b being in contact with each other depending on exposure conditions of each of the ink parts. Namely, by overlapping the first ink part 23a and the second ink part 23b in the boundary portion between them, the first outer layer copper foil 21 is not exposed regardless of the exposure conditions, and reliability of the printed wiring board 10 itself is to be improved.

It should be noted that if the side parts of the first ink part 23a and the second ink part 23b can be surely brought into contact with each other, it is preferable that the first ink part 23a only covers the first outer layer copper foil 21 that is formed on the first face 20a in the portion where the thickness of the inner layer structure body 20 is thinnest, and that the boundary between the first ink part 23a and the second ink part 23b goes along the lateral face of the opening part 11. By doing so, a usage amount of the first ink part 23a can be further reduced, which enables the manufacturing cost of the printed wiring board 10 to be reduced.

Moreover, the layer thicknesses of the first ink part 23a and the second ink part 23b can be properly modified even out of the above-mentioned ranges according to usage of the printed wiring board 10 and reliability required for the same. Herein, in view of improving a property of folding of the printed wiring board 10, preferably, that of the first ink part 23a is 20 μm or less. In view of further excellent heat resistance for compatibility with in-vehicle usage, it is desirable to be 10 μm or more. Note that it may be adjusted to fall within a range, for example, of 5 μm or more and 20 μm or less since such heat resistance as for the in-vehicle usage is not required in the case of typical consumer product usage.

Furthermore, content ratios of the materials regarding the first ink part 23a are not limited by the above-mentioned numerical values but the content ratios can be properly modified as long as the above-mentioned flexibility and heat resistance can be achieved even in the case where its layer thickness is 20 μm or less, and furthermore, a resist constituent material such as resin other than those mentioned above may be mixed therein.

Similarly to the second ink part 23b of the first solder resist layer 23, the second solder resist layer 24 is constituted of a typical member obtained by mixing acrylate resin, acrylic monomer, epoxy resin and filler in a typical mixing ratio. While the layer thickness of the second solder resist layer 24 is adjusted to fall within a range of 20 μm or more and 40 μm or less in the example, it can be properly modified even out of the relevant range according to usage of the printed wiring board 10 and reliability required for the same.

As a manufacturing method of the printed wiring board 10 according to the example, first, etching is performed on a copper clad laminate which is in the state where the first inner layer copper foil 32 and the second inner layer copper foil 33 are pasted on both surfaces of the first glass epoxy layer 31 to perform patterning of the first inner layer copper foil 32 and the second inner layer copper foil 33 thereon and to form an inner layer circuit. Next, the copper clad laminate in the state of having undergone the patterning is interposed between two prepregs, the members in the state of the interposition are pressed under heating with a vacuum press, and thereby, the members are firmly fixed to one another to complete the formation of a basic structure of the inner layer structure body 20 (structure in which the opening part 11 is not formed). Notably, in forming the inner layer structure body 20, conduction vias for the first inner layer copper foil 32 and the second inner layer copper foil 33 are to be properly formed.

Next, the first outer layer copper foil 21 which undergoes patterning is pasted on the first face 20a of the inner layer structure body 20, the second outer layer copper foil 22 which undergoes patterning is pasted on the second face 20b thereof, pressing under heating is performed with a vacuum press, and thereby, the first outer layer copper foil 21 and the second outer layer copper foil 22 are fixed to the inner layer structure body 20.

Next, using a machining tool such as an endmill, spot facing processing is performed on the inner layer structure body 20 from the second face 20b side thereof to form the opening part 11. In this stage, as illustrated in FIG. 1, FIG. 2 and FIG. 4, the portion where the spot facing processing is performed is the portion which is the center of the printed wiring board 10 and is the portion where the second outer layer copper foil 22 or the second inner layer copper foil 33 are not formed (the portion only of the first glass epoxy layer 31 and the third glass epoxy layer 35). Then, the glass cloth 31a of the first glass epoxy layer 31 is penetrated, a part of the epoxy resin 31b of the first glass epoxy layer 31 is removed, and thereby, the spot facing processing completes. For example, the amount of spot facing is to be adjusted such that the distance from the bottom face 11a of the opening part 11 to the surface of the first outer layer copper foil 21 is approximately 230 μm.

Next, solder resist (typical resist member obtained by mixing acrylate resin, acrylic monomer, epoxy resin and filler in a typical mixing ration) is applied so as to cover the inner layer structure body 20, the first outer layer copper foil 21 and the second outer layer copper foil 22. Succeedingly, the solder resist that is applied on a soldering region and on a region which is a region in which the first ink part 23a is formed and is a region in which it is in contact with the first inner layer copper foil 32 is removed by exposure and development processing to form the second ink part 23b and the second solder resist layer 24.

Next, solder resist (special resist member obtained by mixing acrylate resin, acrylic monomer, epoxy resin and filler in a desired mixing ratio) is applied so as to cover the first face 20a of the inner layer structure body 20, the first outer layer copper foil 21 and the second ink part 23b to form the first ink part 23a which covers the first outer layer copper foil 21 that is formed on the partial region 20c of the first face 20a which corresponds to the opening part 11, and a part of the second ink part 23b. Then, after forming the first ink part 23a, heating processing may be performed to set the resist members.

Through the above-mentioned processes, the printed wiring board 10 which is foldable is to be completed.

Notably, in the example, while the inner layer structure body 20 has the structure in which three glass epoxy layers (the first glass epoxy layer 31, the second glass epoxy layer 34 and the third glass epoxy layer 35) are layered via two inner layer copper foils (the first inner layer copper foil 32 and the second inner layer copper foil 33), it is not limited to such a structure. For example, the inner layer structure body 20 may be constituted of one glass epoxy layer and the printed wiring board 10 may have a structure in which the inner layer copper foils are not provided but two layers of copper foils (outer layer copper foils) are included.

Moreover, the layering numbers of the glass epoxy layers and the inner layer copper foils in the inner layer structure body 20 may be increased, for example, it may have six layers of copper foils and the printed wiring board 10 may have a structure in which eight layers of copper foils (six layers of inner layer copper foils and two layers of outer layer copper foils) are included. In this case, the inner layer copper foils may be layered via prepregs using one copper clad laminate or a plurality of copper clad laminates may be layered via prepregs.

Furthermore, in the example, while the first inner layer copper foil 32 and the first outer layer copper foil 21 are present in a folding portion of the printed wiring board 10 in which the opening part 11 as the folding point is formed, a structure in which the inner layer copper foil is not provided in the relevant folding portion may be adopted by adjusting the patterning of the inner layer copper foil. Namely, in the relevant folding portion, the first glass epoxy layer 31 and the second glass epoxy layer 34 are in contact with each other. As to a structure of the folding portion in the case where the layering number of the inner layer copper foils is increased as mentioned above, while it may be the structure in which one inner layer copper foil and one outer layer copper foil are present as in the example, it may be a structure in which no inner layer copper foil is present as mentioned above or a structure in which two or more inner layer copper foils and one outer layer copper foil are present.

<Effects of Examples>

In the printed wiring board 10 according to the example, the inner layer structure body 20 does not contain a resin insulative base material composed only of resin (that is, not containing a glass cloth). Moreover, the glass epoxy layers are constituted of the same materials. Accordingly, as compared with the case where two wiring boards with different modulus of elasticity are used and the case where an adhesive layer or a resin insulative base material not containing a glass cloth is used, for the printed wiring board 10 according to the example, manufacturing costs are reduced, and restriction on the thickness of the printed wiring board 10 itself does not become more serious according to change in the above-mentioned UL standard, which enables a desired standard such as the relevant UL standard to be satisfied.

Moreover, in the printed wiring board 10 according to the example, the first solder resist layer 23 is composed of the first ink part 23a covering at least the first outer layer copper foil 21 that is formed on a partial region of the first face 20a which corresponds to the opening part 11, and the second ink part 23b interposing both ends of first ink part 23a and being lower in flexibility than the first ink part 23a. As above, the first solder resist layer 23 is divided into two regions and disposition of the first ink part 23a and its characteristics are adjusted. Thereby, flexibility at the folding point (folding portion) of the printed wiring board can be improved, and a property of folding and reliability of the printed wiring board 10 itself can be improved.

From the above, the printed wiring board 10 according to the example can reduce costs and satisfy the desired standard and can attain sufficient property of folding and reliability.

Furthermore, in the printed wiring board 10 according to the example, the flexibility of the first ink part 23a is more excellent than the flexibility of the second ink part 23b. By doing so, flexibility at the folding point according to the printed wiring board 10 can be further improved and a property of folding of the printed wiring board 10 itself can be further improved.

Moreover, in the printed wiring board 10 according to the example, the first ink part 23a and the second ink part 23b contain at least acrylate resin, acrylic monomer, epoxy resin and filler, and the first ink part 23a is lower in content ratio of the acrylic monomer than the second ink part 23b. By doing so, the flexibility, heat resistance and durability against various kinds of surface processing of the first ink part 23a are higher than those of the second ink part 23b, and even when the layer thickness of the first ink part 23a is made thinner, sufficient heat resistance and durability against various kinds of surface processing can be maintained. Moreover, since the layer thickness of the first ink part 23a can be made thinner, a property of folding of the printed wiring board 10 can be further improved and costs of the printed wiring board 10 itself can be further reduced.

Moreover, in the printed wiring board 10 according to the example, the layer thickness of the first ink part 23a is 20 μm or less, and thinner than the layer thickness of the second ink part 23b. In this way, the layer thickness of the first ink part 23a is made thin to as more an extent as possible, thereby, a property of folding of the printed wiring board 10 can be improved, furthermore, a usage amount of materials for the first ink part 23a can be reduced, and costs of the printed wiring board 10 itself can be reduced.

<Embodiments of Present Invention>

The printed wiring board according to a first embodiment of the present invention includes: an inner layer structure body containing at least an inner layer insulative base material composed of a glass cloth and resin which covers the glass cloth and not containing a resin insulative base material composed only of resin; outer layer wiring formed on a first face of the inner layer structure body; and a solder resist layer formed on a surface of the outer layer wiring, wherein in the inner layer structure body, an opening part which extends from a second face positioned opposite to the first face toward an inside and does not reach the first face is formed, and the solder resist layer is composed of a first ink part covering at least the outer layer wiring that is formed on a partial region of the first face which corresponds to the opening part and a second ink part interposing both ends of the first ink part and being lower in flexibility than the first ink part.

As to the printed wiring board according to a second embodiment of the present invention, in the printed wiring board according to the first embodiment, for the flexibility of the first ink part, repetition of a desired folding test thereon a plurality of times does not cause a crack therein. In this way, the flexibility at the folding point (folding portion) according to the printed wiring board of the present invention can be improved and the property of folding of the printed wiring board itself according to the present invention can be further improved.

As to the printed wiring board according to a third embodiment of the present invention, in the printed wiring board according to the first embodiment or the second embodiment, each of the first ink part and the second ink part contains at least acrylate resin, epoxy resin and filler. In this way, the first ink part and the second ink part suitable for the printed wiring board can be formed.

As to the printed wiring board according to a fourth embodiment of the present invention, in the printed wiring board according to the third embodiment, the first ink part is lower in content ratio of the acrylic monomer than the second ink part. In this way, flexibility, heat resistance and durability against various kinds of surface processing of the first ink part are higher than those of the second ink part. Even when the layer thickness of the first ink part is made thinner, sufficient heat resistance can be maintained. Since the layer thickness of the first ink part can be made thinner, a property of folding of the printed wiring board can be improved and costs of the printed wiring board itself can be reduced.

As to the printed wiring board according to a fifth embodiment of the present invention, in the printed wiring board according to the first embodiment or the second embodiment, the first ink part contains at least acrylate resin, epoxy resin and filler and does not contain acrylic monomer, and the second ink part contains at least acrylate resin, acrylic monomer, epoxy resin and filler. Even in the case where only the second ink part contains acrylic monomer as above, the similar effect to the fourth embodiment can be attained.

As to the printed wiring board according to a sixth embodiment of the present invention, in the printed wiring board according to any of the first embodiment to the fifth embodiment, the layer thickness of the first ink part is thinner than the layer thickness of the second ink part. The layer thickness of the first ink part is thinner than the layer thickness of the second ink part as above. Thereby, a property of folding of the printed wiring board can be improved, and furthermore, a usage amount of materials for the first ink part can be reduced. Thus, costs of the printed wiring board itself can be reduced.

As to the printed wiring board according to a seventh embodiment of the present invention, in the printed wiring board according to any of the first embodiment to the sixth embodiment, the layer thickness of the first ink part is 20 μm or less. In this way, the layer thickness of the first ink part is made thin to as more an extent as possible. Thereby, a property of folding of the printed wiring board can be improved, and furthermore, a usage amount of materials for the first ink part can be reduced. Thus, costs of the printed wiring board itself can be reduced.

As to the printed wiring board according to an eighth embodiment of the present invention, in the printed wiring board according to any of the first embodiment to the seventh embodiment, the first ink part and the second ink part are layered on the outer layer wiring that is formed on an outer region of the partial region of the first face which corresponds to the opening part. In this way, the outer layer wiring can be surely prevented from being exposed and reliability of the printed wiring board can be improved.

As to the printed wiring board according to a ninth embodiment of the present invention, in the printed wiring board according to any of the first embodiment to the seventh embodiment, the first ink part only covers the outer layer wiring that is formed on the partial region of the first face which corresponds to the opening part, and the second ink part only covers the outer layer wiring that is formed on an outer region of the partial region of the first face which corresponds to the opening part. In this way, a usage amount of materials for the first ink part can be reduced and costs of the printed wiring board itself can be reduced.

As to the printed wiring board according to a tenth embodiment of the present invention, in the printed wiring board according to any of the first embodiment to the ninth embodiment, the inner layer structure body has a structure in which a plurality of the inner layer insulative base materials are layered via inner layer wiring. Inclusion of such a layered structure enables the printed wiring board to be used versatilely and characteristics according to its usage can be readily secured.

EXPLANATION OF REFERENCE SIGNS

10 Printed wiring board
10a First face
10b Second face
11 Opening part
11a Bottom face
20 Inner layer structure body
20a First face
20b Second face
20c Region
21 First outer layer copper foil (outer layer wiring)
22 Second outer layer copper foil (outer layer wiring)
23 First solder resist layer
23a First ink part
23b Second ink part
24 Second solder resist layer
31 First glass epoxy layer (inner layer insulative base material)
31a Glass cloth
31b Epoxy resin
32 First inner layer copper foil (inner layer wiring)
33 Second inner layer copper foil (inner layer wiring)
34 Second glass epoxy layer (inner layer insulative base material)
34a Glass cloth
34b Epoxy resin
35 Third glass epoxy layer (inner layer insulative base material)
35a Glass cloth
35b Epoxy resin

The invention claimed is:

1. A printed wiring board comprising:
an inner layer structure body containing at least an inner layer insulative base material composed of a glass cloth and resin which covers the glass cloth and not containing a resin insulative base material composed only of resin;
outer layer wiring formed on a first face of the inner layer structure body; and
a solder resist layer formed on a surface of the outer layer wiring,
wherein, in the inner layer structure body, an opening part which extends from a second face positioned opposite to the first face toward an inside and does not reach the first face is formed,
the solder resist layer is composed of a first ink part covering at least the outer layer wiring that is formed on a partial region of the first face which corresponds to the opening part and a second ink part interposing both ends of the first ink part and being lower in flexibility than the first ink part,
the first ink part contains at least acrylate resin, epoxy resin and filler,
the second ink part contains at least acrylate resin, acrylic monomer, epoxy resin and filler,
the first ink part is lower in content ratio of the acrylic monomer than the second ink part.

2. The printed wiring board according to claim 1, wherein the first ink part contains acrylic monomer.

3. The printed wiring board according to claim 1, wherein the first ink part does not contain acrylic monomer.

4. The printed wiring board according to claim 1, wherein a layer thickness of the first ink part is thinner than a layer thickness of the second ink part.

5. The printed wiring board according to claim 1, wherein a layer thickness of the first ink part is 20 μm or less.

6. The printed wiring board according to claim 1, wherein the first ink part and the second ink part are layered on the outer layer wiring that is formed on an outer region of the partial region of the first face which corresponds to the opening part.

7. The printed wiring board according claim 1, wherein the first ink part only covers the outer layer wiring that is formed on the partial region of the first face which corresponds to the opening part, and
the second ink part only covers the outer layer wiring that is formed on an outer region of the partial region of the first face which corresponds to the opening part.

8. The printed wiring board according to claim 1, wherein the inner layer structure body has a structure in which a plurality of the inner layer insulative base materials are layered via inner layer wiring.

* * * * *